United States Patent

[11] 3,599,015

[72] Inventor Charles J. Ulrick
Marion, Iowa
[21] Appl. No. 859,721
[22] Filed Sept. 22, 1969
[45] Patented Aug. 10, 1971
[73] Assignee Collins Radio Company
Richardson, Tex.

[54] SENSE AMPLIFIER/DISCRIMINATOR CIRCUIT
1 Claim, 4 Drawing Figs.

[52] U.S. Cl. .......... 307/235, 307/238, 330/28, 330/30 D
[51] Int. Cl. .......... H03k 5/20
[50] Field of Search .......... 330/28, 30, 30 D, 69; 307/235, 237, 238

[56] References Cited
UNITED STATES PATENTS

| | | | |
|---|---|---|---|
| 3,144,504 | 8/1964 | Sikorra | 330/30 UX |
| 3,168,708 | 2/1965 | Stuart-Williams et al. | 330/30 X |
| 3,225,217 | 12/1965 | Corney | 307/300 X |
| 3,304,512 | 2/1967 | McMillan | 330/30 |
| 3,341,785 | 9/1967 | Merryman et al. | 330/30 X |
| 3,466,630 | 9/1969 | Mayne et al. | 330/30 X |
| 3,482,222 | 12/1969 | Vinal | 330/30 X |

*Primary Examiner*—Roy Lake
*Assistant Examiner*—James B. Mullins
*Attorneys*—Warren H. Kintzinger and Robert J. Crawford

ABSTRACT: A sense amplifier/discriminator circuit, capable, for example, of performing with a 1-microsecond memory, that is very stable, extremely wide band, displays a very narrow "gray band," and with critical parameters set by resistor ratios rather than absolute values. It has a differential operational amplifier section followed by a voltage comparator and switch section providing logic level signals out as determined by amplitude of signal input from memory sense lines.

Figures 2, 3, 4:
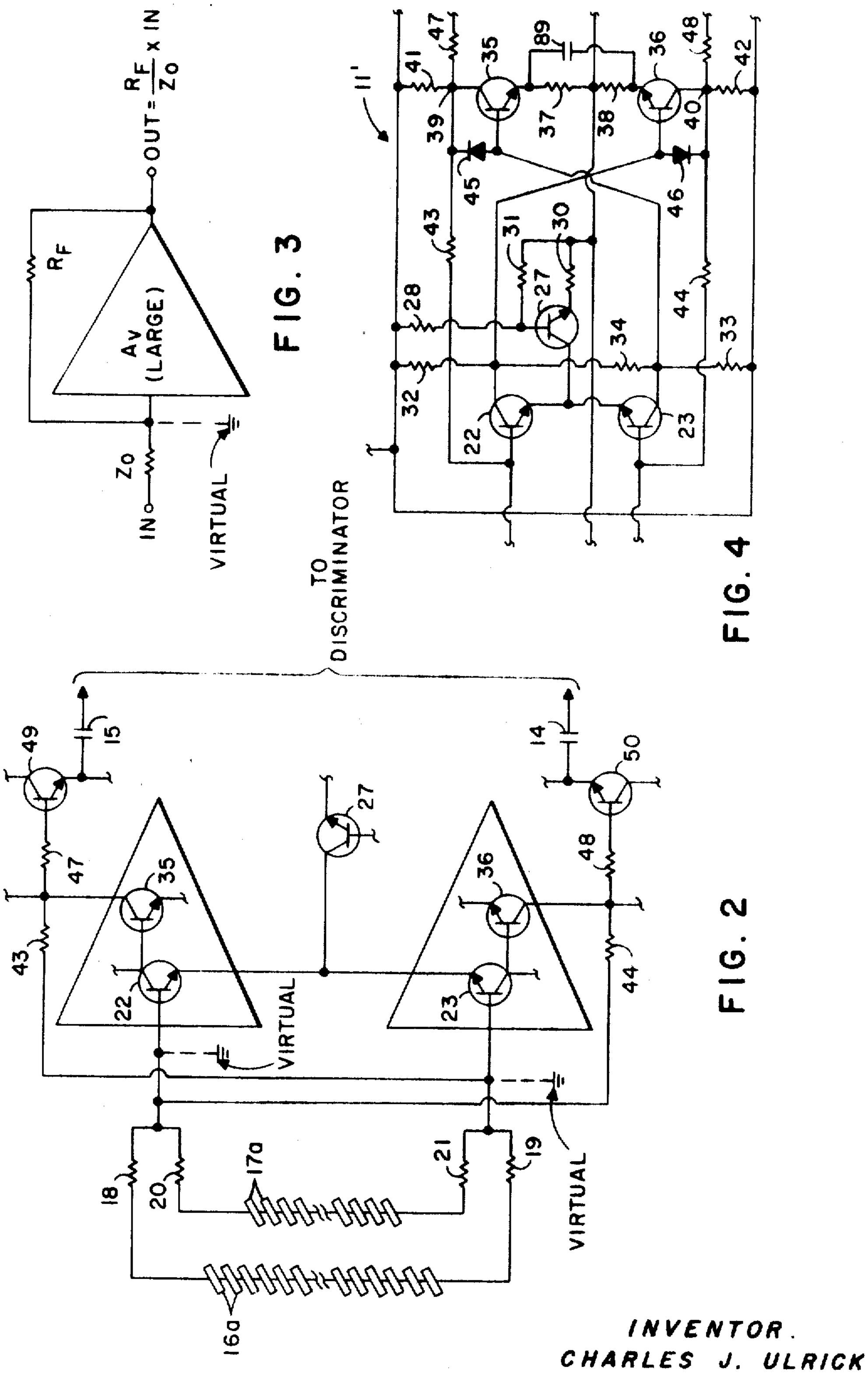

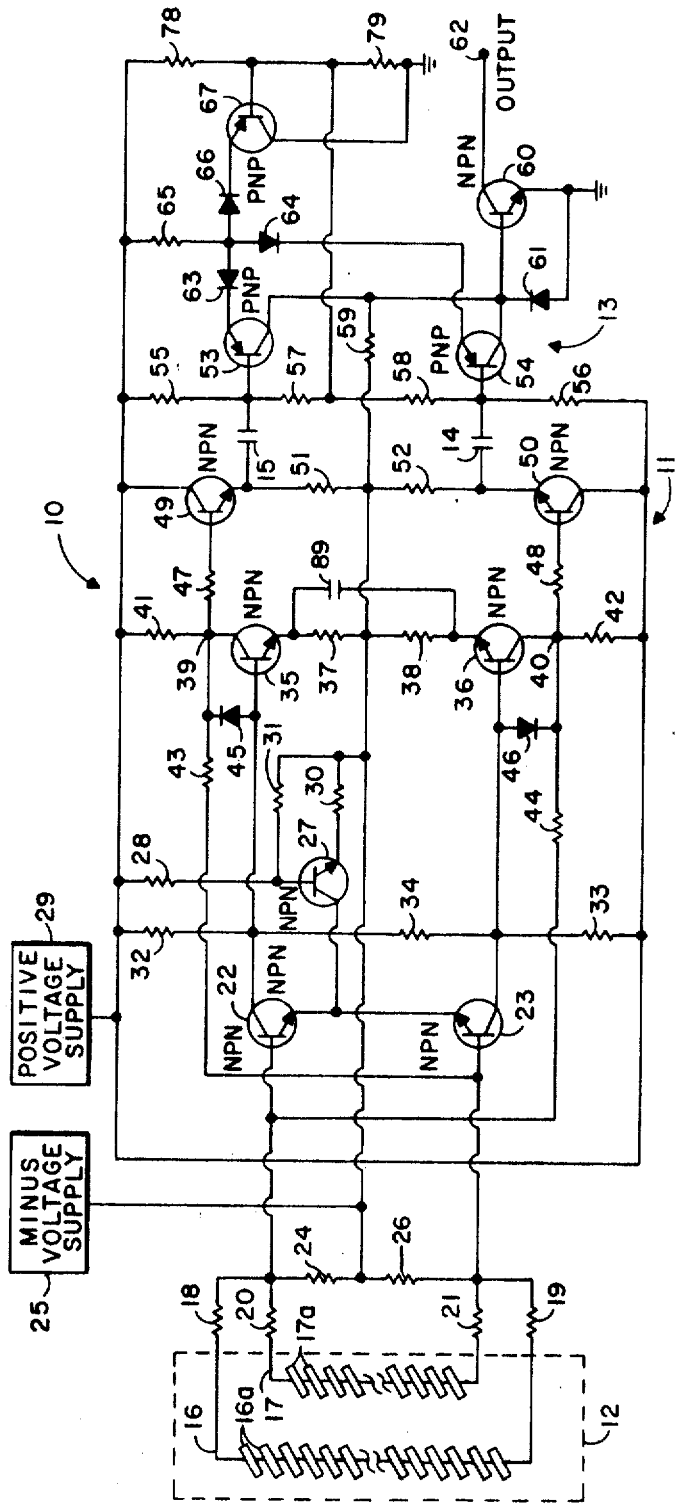
FIG. I
INVENTOR.
CHARLES J. ULRICK
BY Warren H. Kintzinger
ATTORNEY

PATENTED AUG 10 1971 3,599,015

INVENTOR.
CHARLES J. ULRICK
BY Warren H. Kintzinger
ATTORNEY

SENSE AMPLIFIER/DISCRIMINATOR CIRCUIT

This invention relates in general to amplifier/discriminator circuits, and in particular, to an amplifier/discriminator circuit that is basically a differential operational amplifier followed by a voltage comparator and switch section providing logic level signals as determined by amplitude of signal input from, for example, memory sense lines.

There are many stringent requirements imposed in attaining acceptable performance parameters in a sense amplifier and for combined sense amplifier/discriminator circuitry suitable for use in, for example, a 1 μsec. memory either in the discrete component form or in the thin film form. Such a sense amplifier circuit must be very stable, extremely wide band, display, relatively, a very narrow "gray band," and with, in the attainment of operational objectives, all critical parameters being set by resistor ratios rather than through absolute values. To be acceptably useful in such applications, a sense amplifier should exhibit beneficial performance parameter characteristics in operation. These include stable gain approximating 100 plus or minus 10percent, wide bandwidth greater than 10 mc. low delay time less than 20 n. sec., a narrow gray band less than 5 mv., a well-defined input signal threshold level, along with rapid recovery from overload less than 100 n. sec., and a multiple signal input capability of at least two input signals.

It is therefore, a principal object of this invention to provide a sense amplifier having a multi-input capability with substantially no material interference between inputs, and with this accomplished through relatively low component count circuitry.

Another object in such a sense amplifier is to achieve high gain along with sufficiently stable bandwidth such as to provide, relatively, a small signal delay.

A further object is to provide a sense amplifier system giving a logic output signal the state of which is dependent upon input signal voltage levels with respect to a reference voltage with relatively narrow "gray band" characteristics.

Another object is to provide a sense amplifier system configuration particularly adaptable to thin film treatment or discrete component design as desired.

Still another object is to provide such a sense amplifier system with substantially no objectionable output deviation, or drift, resulting from small offsets at the input, and with only enough DC gain to maintain the operating point while gain for AC signals is advantageously at a much higher level.

A further object is to provide fast sense amplifier signal input overload recovery, that is, return to a normal operating point as soon as possible after having experienced a differential overload input signal.

Features of the invention useful in accomplishing the above objects include, a sense amplifier capable of multiple inputs from, for example, multiple sense lines of a memory plane terminated in resistors equal in value to the characteristic impedance of the sense lines so that they do not interfere with each other. Further, gain is set by a resistor ratio between the value of a resistor, in either of the feedback paths of the amplifier, that are matched resistors, to the value of any one of the terminating resistors of the sense lines feeding the two input terminals of the common emitter push pull first transistor stage of the amplifier. The common emitter-connected transistors of the first stage also advantageously share a common current source via a transistor connected in a biasing circuit. The amplifier uses a cross connection between feedback loop sections enabling out-of-phase feedback signaling back to the opposite first-stage transistor in a two-stage amplifier where normally an odd stage, three-stage, five-stage, etc. amplifier is required to attain the same out-of-phase feedback relation. The amplifier has very rapid recovery from overload since there normally is no AC signal on the collectors of the input stage transistors with overload generally causing the output to saturate thereby, in effect, removing feedback. The output collectors of the first stage transistors are also interconnected by a resistor that acts, since the two transistors try to change in opposite directions, to neutralize such change. Thus, when overload is removed the two transistors of the input stage are ready to go at once in normal operational action since they were not permitted to drift or move during overload.

A specific embodiment representing what is presently regarded as the best mode of carrying out the invention is illustrated in the accompanying drawings.

FIG. 1 represents a schematic of may sense amplifier/discriminator circuit in a preferred form that has been reduced to practice; and, FIG. 2, a simplified schematic primarily of the amplifier section of the embodiment of FIG. 1 with many components removed for clarity sake;

FIG. 3, a greatly simplified configuration of an amplifier to illustrate functional relations; and, FIG. 4, a schematic of an alternate sense amplifier section embodiment from that of FIG. 1.

In the sense amplifier/discriminator circuit 10 of FIG. 1 the sense amplifier 11 is shown to have a plurality of DC inputs from a multicore memory plane 12, part of a "three D" memory stack with cores strung in the three-dimensional memory organization well known in the art, for developing an AC signaling output coupled to the discriminator circuit section 13 through AC signal coupling capacitors 14 and 15. While the sense amplifier/discriminator circuit 10 may be used for sensing voltage levels in any of many systems it is shown as being used to sense, for example, the output voltage from two quadrants of a 16,384-core memory plane used in a 1.2-microsecond cycle time memory system. This involves two sense lines 16 and 17 each extended through 4,096 memory cores **16*a* and 17*a* for providing sensed signal outputs from the core memory plane 12 at opposite ends of the lines 16 and 17 connected, respectively, through resistors 18 and 19, and 20 and 21; 18 and 20 in common to the base of NPN transistor 22, and 19 and 21 in common to the base of NPN transistor 23**.

The common junction of the resistors 18 and 20 is connected through resistor 24 to minus voltage supply 25, and the common junction of resistors 19 and 21 is connected through resistor 26 to the minus voltage supply 25. NPN transistors 22 and 23 have a common emitter connection connected to the collector of NPN transistor 27, with a base connection through resistor 28 to positive voltage supply 29, a voltage bias circuit connection from the emitter through resistor 30 to minus voltage supply 25, and also from the base through resistor 31 to the minus voltage supply 25. The collector output electrodes of NPN transistors 22 and 23 are connected, respectively, through resistors 32 and 33 to the positive voltage supply and are also interconnected by resistor 34. These output collector electrodes of NPN transistors 22 and 23 are also connected to the bases of NPN transistors 35 and 36, respectively, having emitter connections through resistors 37 and 38 to the minus voltage supply 25 and with the emitters AC coupled through capacitor 89. This provides AC signal shorting and DC isolation between these emitters. The output collectors of NPN transistors 35 and 36 are connected to signal path terminals 39 and 40, respectively, and through resistors 41 and 42, respectively, to the positive voltage supply 29. These collectors are also connected in feedback circuits from terminal 39 through resistor 43 back to the base of NPN transistor 23, and from terminal 40 back through resistor 44 to the base of NPN transistor 22 in a cross-coupled feedback discussed in more detail later.

It will be noted that a diode 45 has its anode connected to the base of NPN transistor 35 and its cathode to terminal 39, and in like manner diode 46 is connected anode to the base of NPN transistor 36 and cathode to terminal 40. These diodes 45 and 46, clamp the transistors 35 and 36 from overload saturation by limiting the degree thereof. The terminals 39 and 40 are connected through, respectively, resistor 47 and resistor 48 to the bases of NPN transistors 49 and 50. The collectors of transistors 49 and 50 are connected to positive voltage supply 29, the emitters of the transistors, as emitter followers, are connected through resistors 41 and 52, respectively, to the minus voltage supply 25, and in the output signal paths to AC signal coupling capacitors 15 and 14, respectively. The transistors 49 and 50, in the form of an emitter follower stage, are useful as an impedance-matching section between the sense amplifier 11 and the AC signal coupling capacitors 15 and 14 to the discriminator section 13. This is with the amplifier circuit being a two-stage amplifier with DC looping and only AC signal coupling out to the discriminator section. This is with DC coupling only within for stability only. Thus, only two stages of gain are required in a negative feedback amplifier circuit 11 with this achieved through cross coupling of dual feedback paths making out-of-phase feedback signals available without otherwise requiring an odd number of amplification stages.

The AC signal coupling capacitors 15 and 14 are connected, in the discriminator circuit 13, to the bases of PNP transistors 53 and 54, respectively, and through resistors 55 and 56 to the positive voltage supply 29. The bases of transistors 53 and 54 are also interconnected by series-connected resistors 57 and 58, and the common-connected collectors thereof are connected through resistor 59 to the minus voltage supply 25. The common-connected collectors of PNP transistors 53 and 54 are also connected to the base of output signal path NPN transistor 60, having an emitter connection to ground and the base thereof also connected to the cathode of diode 61, and through the diode to ground. The collector output of transistor 60 is connected to signal output terminal 62. For proper function of this discriminator circuit, the emitters of PNP transistors 53 and 54 are connected, respectively, to the cathodes of diodes 63 and 64 having a common anode junction connected through resistor 65 to positive voltage supply 29 and also to the anode of diode 66. The cathode of diode 66 is connected to the emitter of an additional PNP transistor 67 having a base connection to the junction of voltage dividing resistors 78 and 79, serially connected between positive voltage supply 29 and ground, and with this common junction thereof also connected back to the common junction of resistors 57 and 58, and the collector of PNP transistor 67 is connected to ground.

The sense amplifier section 11 provides stable gain with gain determined by the ratio of two resistors, for example resistor 43 to the value of either resistor 19 or 21, or resistor 44 to the value of either resistor 18 or 20. Obviously, resistors 43 and 44 should be matched-value resistors to preserve circuit balance. This is with dual DC loops existing in the amplifier section only and with AC only being coupled out to the discriminator circuit. Generally, only enough DC gain is utilized to maintain the operating point while gain for AC signals is advantageously provided at a much higher level in attaining the desired operational results. The amplifier is a wide band amplifier due to cross coupling between the DC loops and the high feedback factor utilized. It is a sense amplifier with low delay time consistent with its wide band characteristics providing very rapid overload recovery, particularly with diodes 45 and 46 limiting overload saturation of transistors 35 and 36 and with resistor 34 interconnecting the collectors of transistors 22 and 23. It is interesting to note that an overload recovery time from a 2-volt input signal with resistor 34 being a 2 k. resistor was 30 ns., and with a 1 k. resistor the time was 16 ns. whereas, if no resistor 34 is employed the time for recovery is 200 ns. Further, while resistor 34 will reduce open-loop voltage gain, tests have shown that the closed-loop gain is not measurably affected. With resistor 34 equal to 1 k. ohms, the offset at the output is reduced to approximately 10 percent of the offset with no resistor 34 being used in the circuit. Multiple inputs may readily be employed with the sense amplifier with its operational amplifier characteristics. There is an advantageous common mode rejection characteristic obtained with the current source biasing employed for the transistors 22 and 23. Further, printed fabrication is enhanced with most of the operational parameters in the sense amplifier/discriminator circuit being determined by resistor ratios. This amplifier circuit with two stages of amplification is more stable than the usual three stages used with feedback. This is with, in the embodiment of FIG. 1, only two stages of gain in a negative feedback amplifier achieved through cross coupling of dual feedback paths making out-of-phase feedback signal available without requiring an odd number of amplification stages.

In operation the sense amplifier is basically a differential operational amplifier followed by a voltage comparator and switch section capable of providing logic level signals dependent upon the amplitude of the input signal from the memory sense lines. If the sense line signal amplitude is below the threshold of the comparator, the logic output is at the "1" level, that is, with NPN transistor 60 not conducting. When the sense line signal amplitude exceeds the threshold, the logic output will be at the "0" level with transistor 60 in the conductive state.

Referring at this point to the simplified schematic of FIG. 2, with many components and connections not shown, there are, in essence, two parallel high gain direct-coupled amplifiers, transistor 22 with transistor 35, and transistor 23 with transistor 36, connected in the differential mode by the common return through transistor 27, as a bias current source. The dual feedback circuit resistors 43 and 44 effectively reduce each amplifier to the further simplified configuration shown in FIG. 3. With reference thereto, it can be shown that if the open-loop voltage gain $A_v$ is very large compared to the desired closed-loop gain, the ratio $R_f$ over $Z_o$ will be very nearly equal to the closed-loop gain. In addition, the resultant amplifier will have a virtual short circuit to ground at the input terminal. This is indicated by the phantom showing of a connection to ground at the input to the two amplifiers in FIG. 2 and also by the phantom connection to ground in FIG. 3. This means, advantageously, that is several $Z_o$ (resistor) pairs are used, several input signals may be amplified, with no interaction or crosstalk. Thus, it follows, that this principle allows one sense amplifier, as indicated in the embodiment of FIG. 1, to handle two quadrants of a bit plane, and since the input resistors go to a virtual ground, the sense lines are series terminated in their $Z_o$ impedance.

An amplifier built in accord with the sense amplifier section of the FIG. 1 embodiment has exhibited characteristics such as the following:

| | |
|---|---|
| Band width | 20 mc. at Gain = 100 |
| Rise time | 10 ns. |
| Delay time | 15 ns. |
| Voltage output | ± 4v. |
| Overload recovery | 20 ns. (40 mv. $< v_{IN} <$ 1.5v.) |
| Common mode rejection | 1,000 : 1 or better |

These results are obtained with loading effects reduced on the amplifier section by the emitter follower transistors 49 and 50 acting as buffers to isolate the amplifier from the discriminator.

The discriminator has a dual differential voltage comparator including transistors 53, 54, and 67 followed by a saturated switch to define the logic level of the output. Resistors 78 and 79 as a voltage divider set a reference voltage on the base of PNP transistor 67 and secondary dividers with resistors 55 and 57, and resistors 58 and 56 for one state of operation place the voltage level of the bases of the respective transistors 53 and 45 at a slightly more positive voltage than that applied at the base of transistor 67. This causes transistor 67 to conduct all the current supplied through resistor 65, in which state of operation the potential developed at the collector of transistor 53 causes diode 61 to conduct thereby holding transistor 60 off by reverse bias. Conversely, in the operational case where a signal from the amplifier via either capacitor 14 or capacitor 15 causes the base of either transistor 53 or 54 to drop negative enough to overcome the reverse bias developed by the secondary dividers, the current through resistor 65 will be diverted by either transistor 53 or 54, as the case may be, to the base of transistor 60 and resistor 59. Since this current exceeds the normal resistor 59 current, transistor 60 will turn on and be capable of conducting external load current into the output terminals. The gain of the sense amplifier 11 and the ratio of the secondary dividers determines the threshold level of the sense amplifier. With values that have been used the circuit had an input signal threshold of 17 millivolts plus or minus 2 millivolts differential.

Components and values used in a sense amplifier/discriminator circuit giving operational results as set forth and in accord with the embodiment of FIG. 1 include he following:

| | |
|---|---|
| Capacitors 14 and 15 | 0.01 μf. |
| Resistors 18, 19, 20 and 21 | 147 ohms |
| NPN Transistors 22, 23, 27, 35, 36, 49, 50 and 60 | 2N918 |
| Resistors 24 and 26 | 30 k. ohms |
| Voltage Supply 25 | −20 volts |
| Resistors 28, 41, and 42 | 2.37 k. ohms |
| Voltage Supply 29 | +20 volts |
| Resistor 30 | 1.96 k. ohms |
| Resistor 31 | 1.62 k. ohms |
| Resistors 32 and 33 | 3.83 k. ohms |
| Resistors 34, 47, 48, 78, and 79 | 1 k. ohms |
| Resistors 37 and 38 | 6.19 k. ohms |
| Capacitor 89 | 0.1 μf. |
| Resistors 43, and 44 | 14.7 k. ohms |
| Diodes 45, 46, 61, 63, 64, and 66 | 1N914 |
| Resistors 51, and 52 | 7.5 k. ohms |
| PNP Transistors 53, 54, and 67 | 2N4209 |
| Resistors 55, 56, and 59 | 22 k. ohms |
| Resistors, 57, and 58 | 1.8 k. ohms |
| Resistor 65 | 2.64 k. ohms |

Please refer now to FIG. 4 for an alternate sense amplifier section 11′ embodiment wherein all the components are the same and numbered the same as with the embodiment as FIG. 1 with, however, the dual DC loops through the two-stage amplifier being crossed within the amplifier between the stages rather than in feedback path portions of the dual DC loops thereof. This is with terminal 39 connected back through resistor 43 to the base of NPN transistor 22 and terminal 40 connected back through resistor 44 to the base of transistor 23. Furthermore, the collector output of transistor 22 is connected across to the base of transistor 36 while the collector output of transistor 23 is connected across to the base of the NPN transistor 35. This crossover within and change in the connections in feedback to the opposite transistor bases from that of the embodiment of FIG. 1 give substantially the same advantageous operational results. It provides a negative feedback amplifier having only two stages of the gain achieved through cross coupling between dual DC path loops. This results in the feedback signal to the inputs of the respective transistors 22 and 23 being out of phase without the requirement of an odd number of amplification stages.

Whereas this invention is herein illustrated and described with respect to specific embodiments hereof, it should be realized that various changes may be made without departing from the essential contributions to the art made by the teachings hereof.

I claim:

1. Sensing, amplifying, and voltage-comparing apparatus comprising, in combination:

power supply means including positive terminal means, negative terminal means, and ground reference terminal means;

first and second NPN transistor means, each including base, collector, and emitter means;

third NPN transistor means connected to said emitter means of said first and second transistor means and to said negative power supply means for providing current source biasing circuit;

a plurality of sense lines and line end resistive means connected in parallel between said base means of said first and second transistor means, the line end resistive means having a resistive value substantially equal to the characteristic impedance of the respective ones of said sense lines;

fourth, fifth, sixth, and seventh NPN transistor means each including emitter, collector, and base means;

means connecting said collector of said first transistor means and said base means of said fourth transistor means together and to said positive terminal means;

means connecting collector means of said second transistor means and said base means of said fifth transistor means together and to said positive terminal means;

first feedback means connecting said collector means of said fourth transistor means to said base means of said second and said fourth transistor means, wherein said means includes diode means for limiting overload saturation of said fourth transistor means;

second feedback means connecting said collector means of said fifth transistor means to said base means of said first and said fifth transistor means wherein said means includes diode means for limiting overload saturation of said fifth transistor means;

means connecting said base means of said sixth and seventh transistor means to said collector means of said fourth and fifth transistor means, respectively, together and to said positive terminal means;

means connecting said emitters of said fourth, fifth, sixth, and seventh transistor means to said negative terminal means;

capacitor means connected between said emitter means of said fourth and fifth transistor means for AC signal shorting and DC isolation therebetween;

voltage-dividing means connected between said positive terminal means and said ground reference terminal means and providing a comparison output voltage;

PNP eighth, ninth, and tenth transistor means each including emitter means, base means, and collector means and forming as connected a differential voltage comparison circuit means;

diode means separately connecting each of said emitter means of said PNP transistor means to said positive terminal means;

AC coupling means connecting said emitter means of said sixth and seventh transistor means, respectively, to base means of said eighth and ninth transistor means, respectively;

said first, second, third, fourth, and fifth transistor means providing signal amplification of signals supplied by said sense lines and said sixth and seventh transistor means providing isolation between said amplification and said voltage comparison circuit means;

means connecting said base means of said tenth transistor means to the voltage-divided comparison output of said voltage-dividing means;

NPN eleventh transistor means for providing a switched output signal and including base means, emitter means, and output collector means;

means connecting said collector means of said tenth transistor means and said emitter means of said eleventh transistor means to said ground reference terminal means; and biasing means connecting said collector means of said eighth and ninth transistor means to said base means of said 11th transistor means for biasing said 11th transistor means to an OFF condition in the absence of signals from said sense lines.